United States Patent
Tang et al.

(10) Patent No.: US 11,764,507 B2
(45) Date of Patent: Sep. 19, 2023

(54) CONDUCTIVE TERMINAL FOR ELECTRONIC CIRCUIT BOARD INCLUDING PRESSING AND SUPPORT STRUCTURES

(71) Applicant: Tyco Electronics (Shanghai) Co. Ltd., Shanghai (CN)

(72) Inventors: Zebin (Donnie) Tang, Shanghai (CN); Liming (Eric) Wang, Shanghai (CN); Xinxin (Daisy) Li, Shanghai (CN)

(73) Assignee: Tyco Electronics (Shangahi) Co., Ltd., Shanghai (CN)

( * ) Notice: Subject to any disclaimer, the term of this patent is extended or adjusted under 35 U.S.C. 154(b) by 129 days.

(21) Appl. No.: 17/380,521

(22) Filed: Jul. 20, 2021

(65) Prior Publication Data
US 2022/0021144 A1    Jan. 20, 2022

(30) Foreign Application Priority Data

Jul. 20, 2020   (CN) .......................... 202021428084.6

(51) Int. Cl.
*H01R 13/04* (2006.01)
*H05K 1/18* (2006.01)

(52) U.S. Cl.
CPC .............. *H01R 13/04* (2013.01); *H05K 1/182* (2013.01); *H05K 2201/10295* (2013.01)

(58) Field of Classification Search
CPC . H01R 13/04; H05K 1/82; H05K 2201/10295
USPC .......................................................... 439/884
See application file for complete search history.

(56) References Cited

U.S. PATENT DOCUMENTS

| | | | | |
|---|---|---|---|---|
| 5,286,218 A | * | 2/1994 | Sakurai | H01R 13/5045 439/444 |
| 5,743,769 A | * | 4/1998 | Koguchi | H01R 12/585 439/943 |
| 6,129,565 A | * | 10/2000 | Lai | H01R 13/428 439/98 |
| 6,152,782 A | * | 11/2000 | Volkert | H01R 13/41 439/747 |
| 6,716,073 B1 | * | 4/2004 | Lee | H01R 13/04 439/885 |
| 6,997,756 B2 | * | 2/2006 | Nakamura | H01R 13/41 439/733.1 |

(Continued)

FOREIGN PATENT DOCUMENTS

| | | | |
|---|---|---|---|
| DE | 102017111293 A1 | * 11/2018 | ............ H01R 13/04 |
| EP | 952632 A2 | * 10/1999 | ............ H01R 13/41 |
| JP | 2014209407 A | * 11/2014 | |

*Primary Examiner* — Peter G Leigh
(74) *Attorney, Agent, or Firm* — Barley Snyder

(57) ABSTRACT

A conductive terminal comprises a pair of abutting plate-shaped body parts having a front side and a rear side opposite to each other in a thickness direction thereof, and a left side and a right side opposite to each other in a width direction thereof. An insertion part extends from one of the two body parts. The terminal further includes a pair of first supporting wings arranged on the front side and the rear side of the body parts and aligned with each other at edges of the left side of the two body parts, respectively, and a pair of second supporting wings arranged on the front side and the rear side of the two body parts and aligned with each other at edges of the right side of the two body parts, respectively.

20 Claims, 5 Drawing Sheets

(56) References Cited

U.S. PATENT DOCUMENTS

| | | | | |
|---|---|---|---|---|
| 7,104,812 B1* | 9/2006 | Bogiel | ................ | H01R 12/724 |
| | | | | 439/79 |
| 7,179,123 B2* | 2/2007 | Ohara | .................... | H01R 13/04 |
| | | | | 439/733.1 |
| 8,118,623 B2* | 2/2012 | Tung | ...................... | H01R 43/16 |
| | | | | 439/884 |
| 9,502,816 B2* | 11/2016 | Hashimoto | ............ | H01R 13/62 |
| 9,705,227 B2* | 7/2017 | Hossaini | ................ | H01R 13/04 |
| 10,680,375 B2* | 6/2020 | Li | .......................... | H01R 12/58 |
| 2005/0277341 A1* | 12/2005 | Noguchi | ................ | H01R 13/41 |
| | | | | 439/884 |
| 2007/0004291 A1* | 1/2007 | Bogiel | ................ | H01R 12/724 |
| | | | | 439/884 |
| 2009/0011658 A1* | 1/2009 | Shibata | ................ | H01R 13/41 |
| | | | | 439/736 |

* cited by examiner

CONDUCTIVE TERMINAL FOR ELECTRONIC CIRCUIT BOARD INCLUDING PRESSING AND SUPPORT STRUCTURES

CROSS-REFERENCE TO RELATED APPLICATIONS

This application claims priority under 35 U.S.C. § 119 to Chinese Patent Application No. 202021428084.6 filed on Jul. 20, 2020, the entire disclosure of which is incorporated herein by reference.

FIELD OF THE INVENTION

The present disclosure relates to a conductive terminal, and in particular, to a conductive terminal suitable for insertion into circuit board.

BACKGROUND

Conductive terminals are often required to be inserted into a circuit board, and maintained in a particular orientation therewith (e.g., perpendicular to a surface of the circuit board) during manufacturing and/or use. Terminals of the prior art accomplish this via the formation a single supporting wing on each of left and right sides of the terminal. This single supporting wing structure, however, is asymmetrical relative to the front and rear sides of the terminal. As a result, it remains difficult to ensure the desired position of the terminal relative to the circuit board.

SUMMARY

A conductive terminal according to an embodiment of the present disclosure comprises a pair of abutting plate-shaped body parts having a front side and a rear side opposite to each other in a thickness direction, and a left side and a right side opposite to each other in a width direction. An elongated insertion part extends from one of the two body parts for engaging with a circuit board. The terminal further includes a pair of first supporting wings arranged on the front side and the rear side of the body parts and aligned with each other at edges of the left side of the two body parts, respectively, and a pair of second supporting wings arranged on the front side and the rear side of the two body parts and aligned with each other at edges of the right side of the two body parts, respectively.

BRIEF DESCRIPTION OF THE DRAWINGS

The invention will now be described by way of example with reference to the accompanying Figures, of which.

DETAILED DESCRIPTION OF THE EMBODIMENTS

Figure 1:
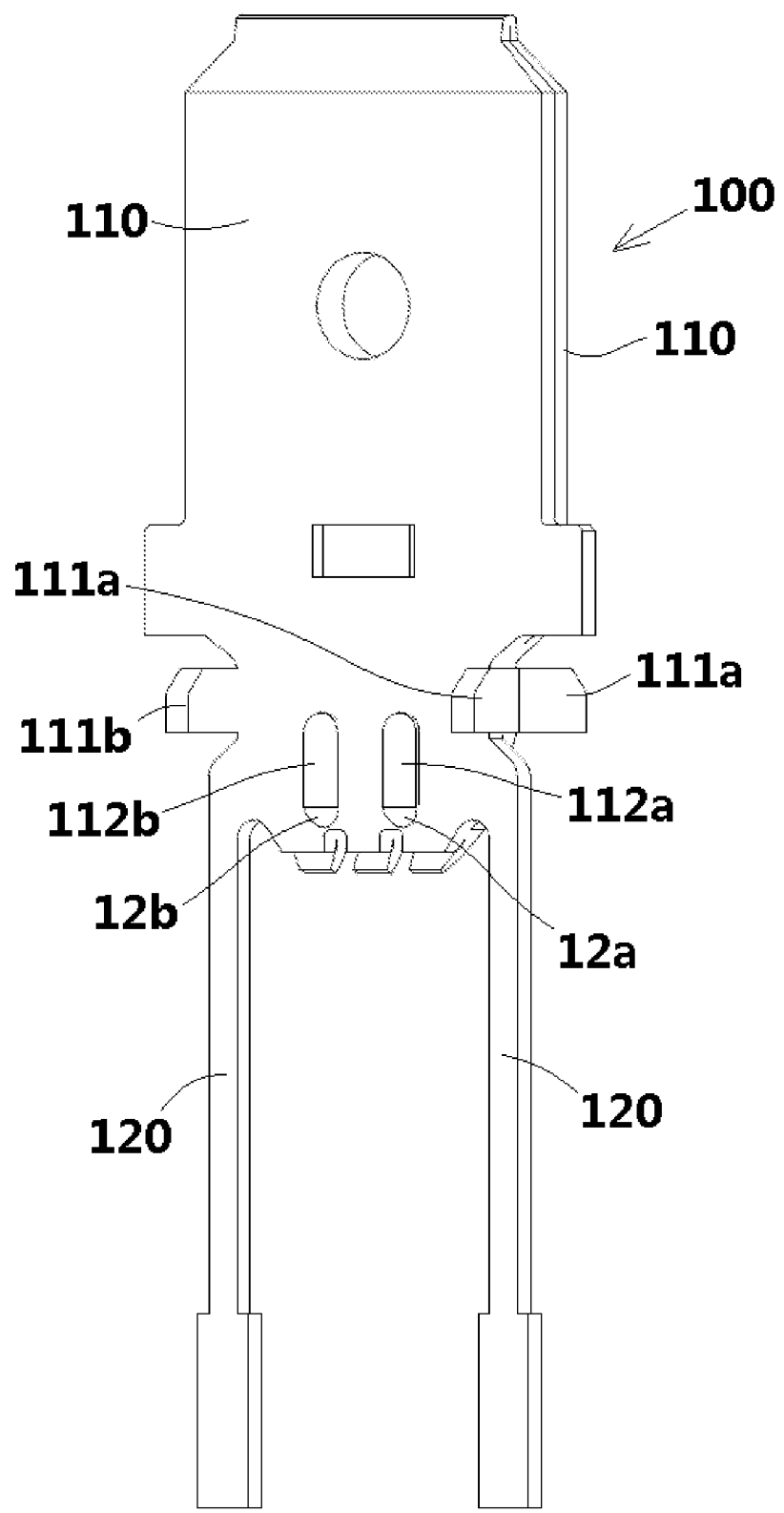
FIG. 1 shows a schematic perspective view of a conductive terminal according to an exemplary embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to one aspect of the disclosure, a conductive terminal is provided comprising a pair of abutting plate-shaped body parts having opposite front and rear sides, and opposite left and right sides. An elongated insertion part extends from one of the two body parts for engaging with a circuit board. The terminal further includes a pair of first supporting wings arranged on the front side and the rear side of the body parts and aligned with each other at edges of the left side of the two body parts, respectively, and a pair of second supporting wings arranged on the front side and the rear side of the two body parts and aligned with each other at edges of the right side of the two body parts, respectively.

Figure 4:
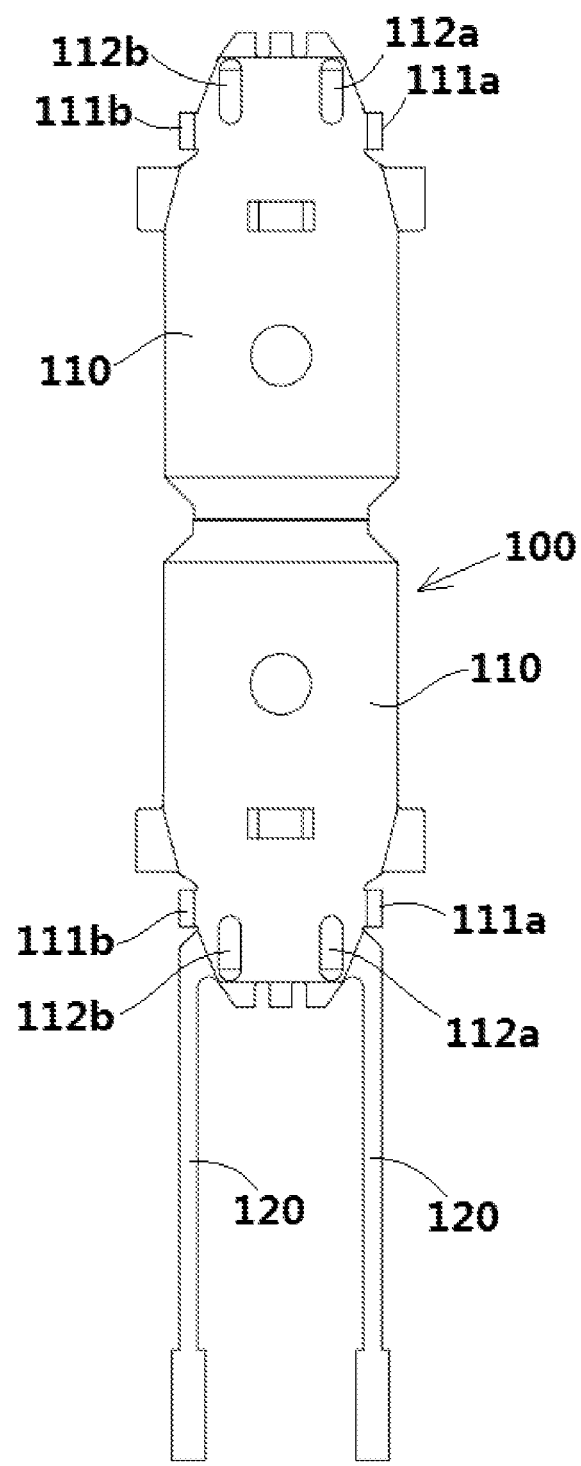
FIG. 4 shows a plan expanded view of the conductive terminal shown in FIG. 1.

FIG. 1 shows a schematic perspective view of a conductive terminal 100 according to an exemplary embodiment of the present disclosure, and FIG. 4 shows a plan expanded view of the conductive terminal 100 shown in FIG. 1. As shown in FIGS. 1 and 4, in one embodiment the conductive terminal 100 is a single integral piece formed by folding a single metal sheet. The conductive terminal 100 includes two body parts 110 and an insertion part in the form of a pair of connection legs 120. The two body parts 110 are plate-shaped and stacked together. Further, the two body parts 110 have a front side and a rear side opposite to each other in a thickness direction thereof, as well as a left side and a right side opposite to each other in a width direction thereof. The insertion part extends from one of the two body parts 110 by a first predetermined distance.

Figure 2:
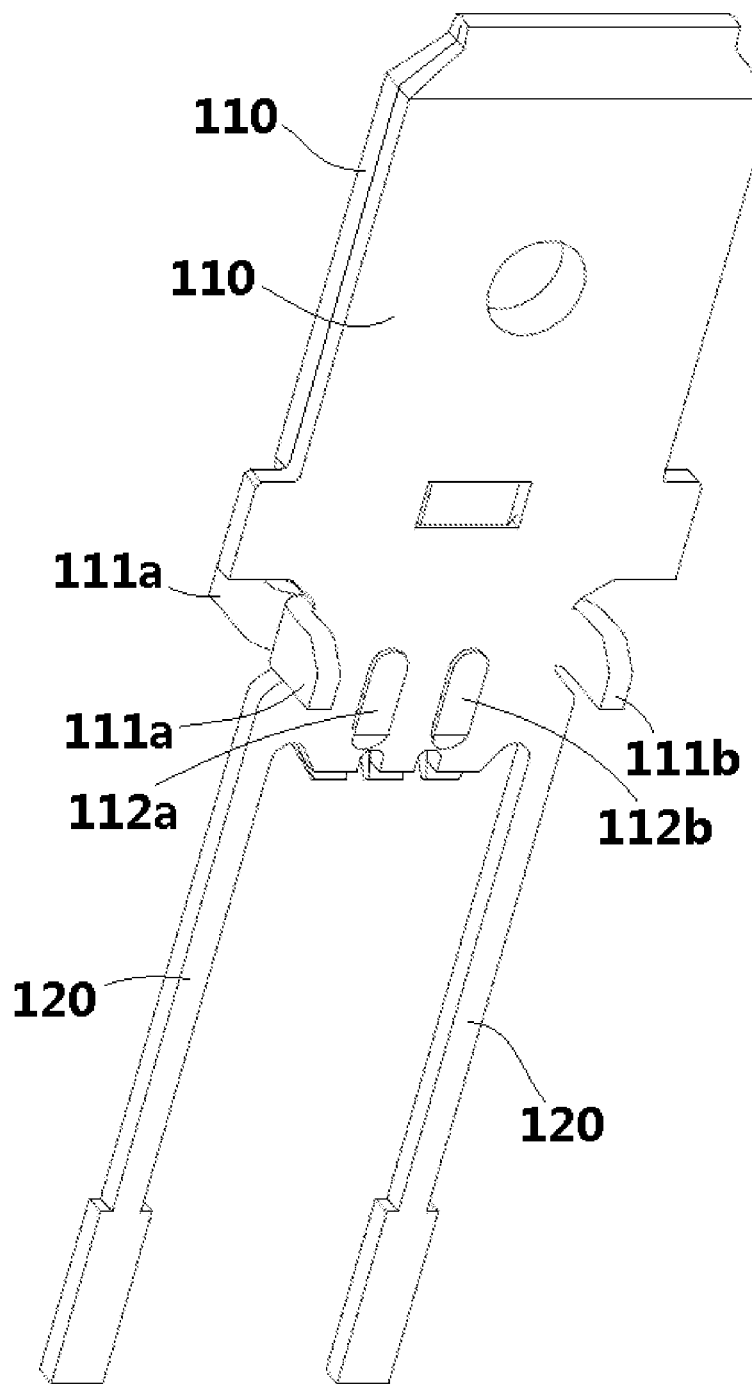
FIG. 2 shows a schematic perspective view of the conductive terminal shown in FIG. 1 viewed from one side in a thickness direction thereof.
Figure 3:
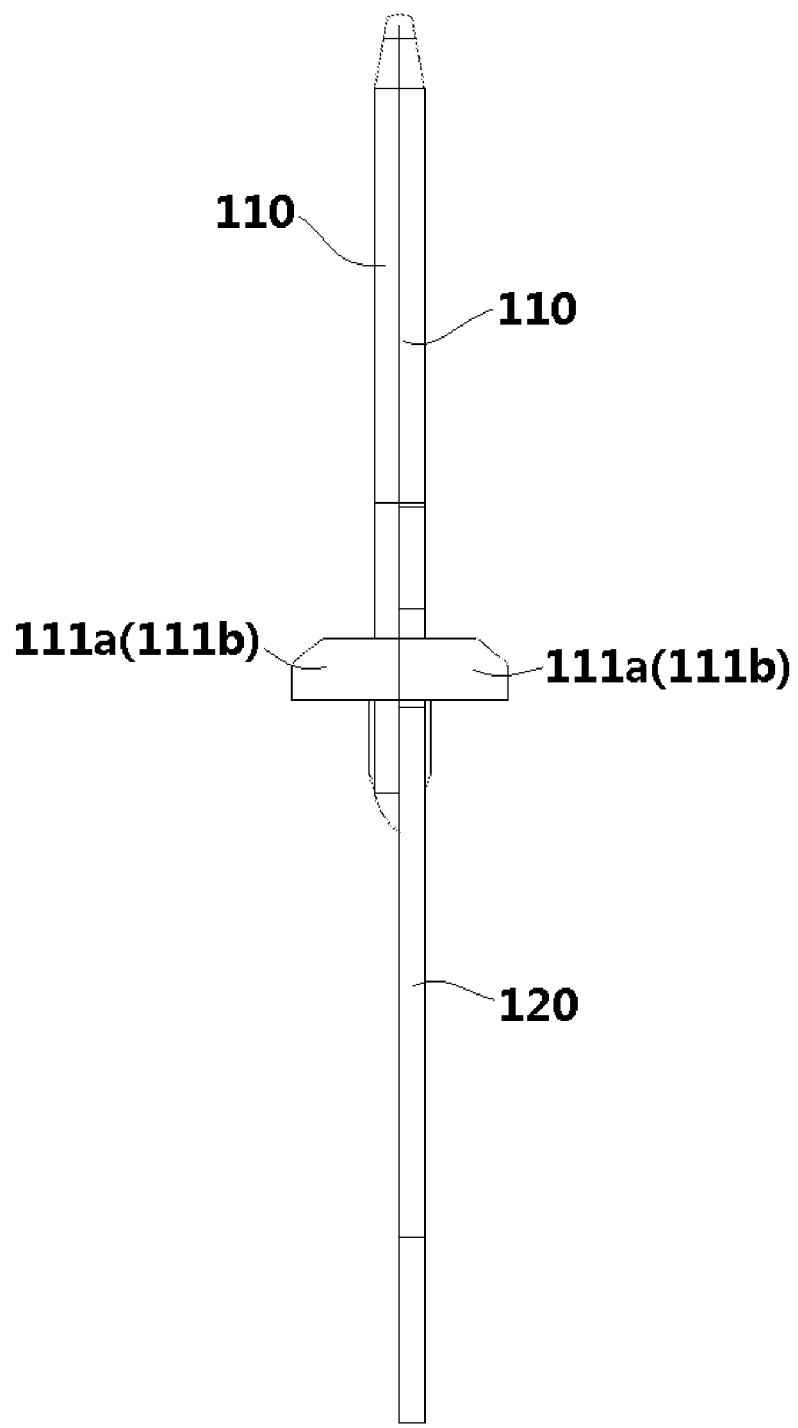
FIG. 3 shows a schematic perspective view of the conductive terminal shown in FIG. 1 viewed obliquely from one side in a width direction thereof.

FIG. 2 shows a schematic perspective view of the conductive terminal 100 shown in FIG. 1 when viewed from one side in the thickness direction thereof, and FIG. 3 shows a schematic perspective view of the conductive terminal 100 shown in FIG. 1 when viewed obliquely from one side in the width direction thereof. As shown in FIGS. 1-3, the conductive terminal 100 further includes a pair of first supporting wings or feet 111a and a pair of second supporting wings or feet 111b. The pair of first supporting wings 111a are symmetrically arranged on the front side and the rear side of the body parts 110 and aligned with each other at edges of the left side of the two body parts 110, respectively. The pair of second supporting wings 111b are symmetrically arranged on the front side and the rear side of the two body parts 110 and aligned with each other at edges of the right side of the two body parts 110, respectively.

Figure 5:
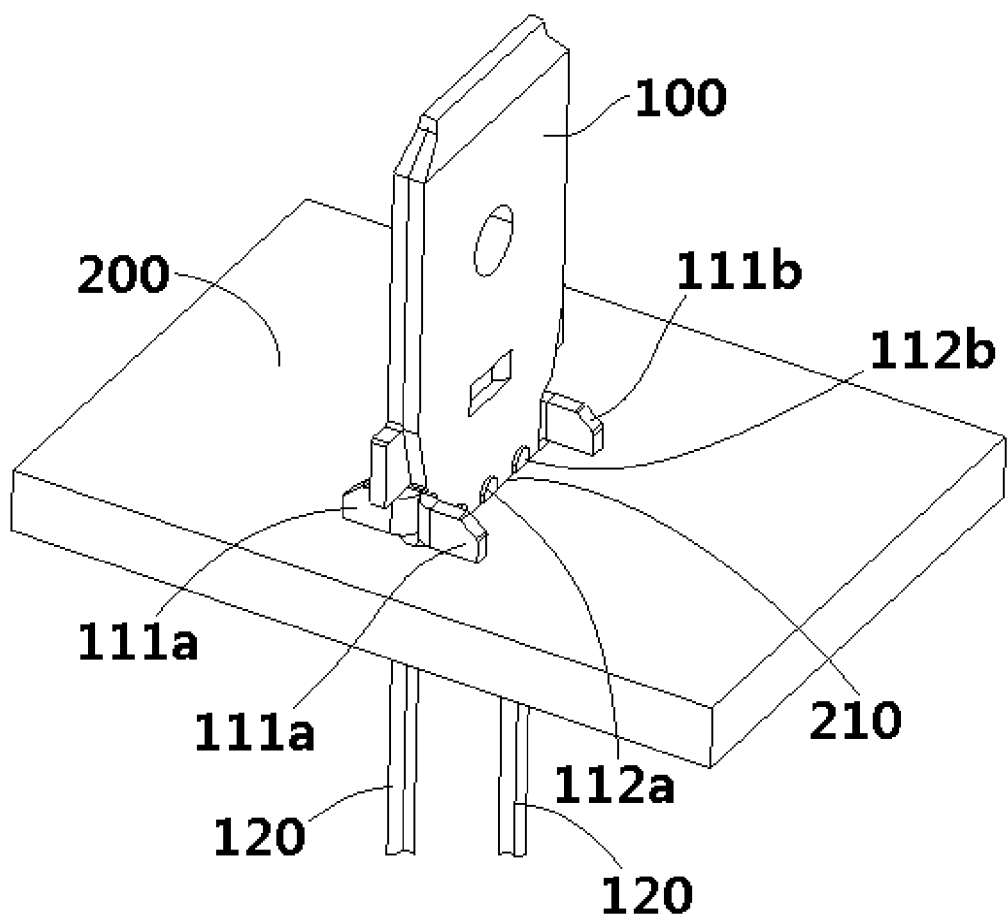
FIG. 5 shows a schematic view of the conductive terminal shown in FIG. 1 inserted and fitted into a slot of a circuit board.

FIG. 5 shows a schematic view of the conductive terminal 100 shown in FIG. 1 inserted into a slot 210 of a circuit board 200. As shown in FIGS. 1-5, when the conductive terminal 100 is inserted into the slot 210 of the circuit board 200, the pair of first supporting wings 111a and the pair of second supporting wings 111b are supported on a surface of the circuit board 200 such that the conductive terminal 100 is oriented perpendicularly to the circuit board 200. Specifically, the pair of first supporting wings 111a and the pair of second supporting wings 111b have supporting bottom surfaces located in the same plane. As the conductive terminal 100 is inserted into the slot 210 in the circuit board 200, the supporting bottom surfaces of the pair of first supporting wings 111a and the pair of second supporting wings 111b are brought in contact with the surface of the circuit board 200. The first supporting wings 111a and the second supporting wings 111b may be sheet-shaped and configured to be perpendicular to the surface of the circuit board 200 when supported on the circuit board 200.

The pair of first supporting wings 111a and the pair of second supporting wings 111b are identical to each other and are arranged symmetrically on the left side and the right side of the body parts 110. One of the pair of first supporting wings 111a extends forwards in the thickness direction of the respective body part 110 by a second predetermined distance, and the other extends rearwards in the thickness direction of the respective body part 110 by a third predetermined distance. The second predetermined distance may be equal to the third predetermined distance as shown in FIG. 3. In another embodiment, the second predetermined distance may be different from the third predetermined distance. Likewise, one of the pair of second supporting wings 111b extends forwards in the thickness direction of the respective body part 110 by a fourth predetermined distance, and the other extends rearwards in the thickness direction of the respective body part 110 by a fifth predetermined distance. The fourth predetermined distance may be equal to the fifth predetermined distance as shown in FIG. 3. In an embodiment, the fourth predetermined distance may be different from the fifth predetermined distance. According to embodiments, the second, the third, the fourth and the fifth predetermined distance may be equal to one another. However, they may be different from one another in other embodiments of the present disclosure.

As shown in FIGS. 1-5, at least one strip-shaped positioning protrusion 112a, 112b is formed on an outer surface of each of the two body parts 110. The at least one positioning protrusion 112a, 112b is adapted to contact a sidewall of the slot 210 to prevent the conductive terminal 100 from moving in the thickness direction of the body parts 110. The at least one positioning protrusion 112a, 112b includes a pair of first positioning protrusions 112a and a pair of second positioning protrusions 112b. The pair of first positioning protrusions 112a are symmetrically arranged on the front side and the rear side of the conductive terminal 100, and are formed on the two body parts 110 proximate the left side of the body parts 110, respectively. The pair of second positioning protrusions 112b are symmetrically arranged on the front side and the rear side of the conductive terminal 100 respectively and are formed on the two body parts 110 proximate the right side of the body parts 110. Moreover, an inclined guide surface 12a, 12b is formed on a lower part of the at least one positioning protrusion 112a, 112b to guide the body parts 110 as they are inserted into the slot 210 of the circuit board 200.

As set forth above, the insertion part of the conductive terminal 100 includes two connection legs 120 connected to a lower portion of one of the two body parts 110 at the left side and the right side respectively, and extending in a length direction of the body parts 110 by the first predetermined distance. The connection legs 120 may have an increased thickness and/or width at their distal ends.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A conductive terminal, comprising:
   a pair of abutting plate-shaped body parts having a front side and a rear side opposite to each other in a thickness direction thereof and a left side and a right side opposite to each other in a width direction thereof;
   an insertion part extending from one of the two body parts;
   a pair of first supporting wings arranged on the front side and the rear side of the body parts and aligned with each other at edges of the left side of the two body parts, respectively;
   a pair of second supporting wings arranged on the front side and the rear side of the two body parts and aligned with each other at edges of the right side of the two body parts, respectively; and
   at least one positioning protrusion formed on an outer surface of each of the two body parts, each positioning protrusion extending in a forward and rearward direction, respectively, and arranged below the first and second supporting wings in a length direction of the conductive terminal, the positioning protrusion engaging with an opening in a circuit board for preventing movement of the conductive terminal in the thickness direction of the body parts.

2. The conductive terminal according to claim 1, wherein the pair of first supporting wings and the pair of second supporting wings have bottom surfaces located in the same plane.

3. The conductive terminal according to claim 1, wherein the pair of first supporting wings and the pair of second supporting wings are arranged symmetrically on the left side and the right side of the body parts.

4. The conductive terminal according to claim 1, wherein one of the pair of first supporting wings extends forward in the thickness direction of the body parts, and the other extends rearward in the thickness direction of the respective body part.

5. The conductive terminal according to claim 4, wherein one of the pair of second supporting wings extends forward in the thickness direction of the body parts, and the other extends rearward in the thickness direction of the body parts.

6. The conductive terminal according to claim 1, wherein the first supporting wings and the second supporting wings are sheet-shaped and configured to be perpendicular to a surface of a circuit board when supported on the circuit board.

7. The conductive terminal according to claim 1, further comprising an inclined guide surface formed on a lower part of the at least one positioning protrusion for guiding the body parts into the opening of the circuit board.

8. The conductive terminal according to claim 1, wherein the at least one positioning protrusion comprises:
   a pair of first positioning protrusions symmetrically arranged on the front side and the rear side of the conductive terminal respectively, and formed on the two body parts proximate the left side of the body parts, respectively; and
   a pair of second positioning protrusions symmetrically arranged on the front side and the rear side of the conductive terminal and formed on the two body parts proximate the right side of the body parts, respectively.

9. The conductive terminal according to claim 1, wherein the insertion part includes two legs connected to a lower portion of one of the body parts at the left side and the right side respectively and extending in a length direction of the body parts.

10. The conductive terminal according to claim 1, wherein the two body parts are formed integrally by folding a single metal sheet.

11. A conductive terminal, comprising:
    a plate-shaped body defining:
        an elongated insertion part extending from the body to be inserted into a circuit board;
        a first supporting foot arranged proximate a first side of the body and extending in both a forward and a rearward direction relative to the body;
        a second supporting foot arranged proximate a second side of the body and extending in both the forward and the rearward direction relative to the body; and
        a positioning protrusion formed on each of a front side and a rear side of the body, each positioning protrusion extending in the forward and the rearward direction, respectively, and arranged below the first and second supporting feet in a length direction of the conductive terminal.

12. The conductive terminal according to claim 11, further comprising a guide surface extending obliquely downward from a lower part of at least one of the positioning protrusions.

13. The conductive terminal according to claim 11, wherein the positioning protrusions comprise a pair of first positioning protrusions symmetrically arranged on each of the front and rear sides of the body.

14. The conductive terminal according to claim 11, wherein first and second supporting feet are arranged symmetrically on the body.

15. The conductive terminal according to claim 11, wherein the body is formed by two stacked plate-like body parts.

16. The conductive terminal according to claim 15, wherein the two body parts are integrally formed by a folded conductive sheet.

17. The conductive terminal according to claim 15, wherein each supporting foot is formed from each of the two stacked body parts.

18. The conductive terminal according to claim 15, wherein the insertion part includes two legs extending from one of the two stacked body parts.

19. A conductive terminal, comprising:
    a plate-shaped body defining:
        a plate-shaped upper body part;
        an elongated insertion part extending from the upper body part body and inserted into a circuit board;
        a first supporting foot arranged proximate a first side of the body and between the upper body part and the insertion part, the first supporting foot extending beyond front and rear planar surfaces defined by the upper body part in both a forward and a rearward direction relative to the upper body part; and
        a second supporting foot arranged proximate a second side of the body and between the upper body part and the insertion part, the second supporting foot extending beyond the front and rear planar surfaces defined by the upper body part in both the forward and the rearward direction relative to the upper body part,
    wherein bottom surfaces of each of the first and second supporting feet abut a support surface of the circuit board.

20. The conductive terminal according to claim 19, wherein the upper body part is formed by a pair of abutting plate-shaped body parts, a portion of each of the first and second supporting feet extend from each of the pair of abutting plate-shaped body parts.

\* \* \* \* \*